United States Patent

Herrmann et al.

[11] Patent Number: 6,134,707
[45] Date of Patent: *Oct. 17, 2000

[54] APPARATUS AND METHOD FOR IN-SYSTEM PROGRAMMING OF INTEGRATED CIRCUITS CONTAINING PROGRAMMABLE ELEMENTS

[75] Inventors: Alan L. Herrmann, Sunnyvale; Timothy J. Southgate, Redwood City, both of Calif.

[73] Assignee: Altera Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/872,652

[22] Filed: Jun. 10, 1997

Related U.S. Application Data

[60] Provisional application No. 60/030,909, Nov. 14, 1996.

[51] Int. Cl.$^7$ .................................................. H03K 19/177
[52] U.S. Cl. .................. 717/5; 395/500.02; 395/500.17; 709/208; 716/16; 716/17
[58] Field of Search .................................. 395/705, 712; 716/16, 17; 717/5

[56] References Cited

U.S. PATENT DOCUMENTS

| | | | |
|---|---|---|---|
| 5,426,378 | 6/1995 | Ong | 326/39 |
| 5,498,979 | 3/1996 | Parlour et al. | 326/38 |
| 5,633,813 | 5/1997 | Srinivasan | 364/578 |
| 5,737,631 | 4/1998 | Trimberger | 395/800.37 |
| 5,748,979 | 5/1998 | Trimberger | 395/800.37 |
| 5,752,035 | 5/1998 | Trimberger | 395/705 |
| 5,815,405 | 9/1998 | Baxter | 395/500.04 |
| 5,946,219 | 8/1999 | Mason et al. | 395/500.17 |
| 5,949,987 | 9/1999 | Curd et al. | 395/500.17 |
| 5,971,595 | 10/1999 | Grant et al. | 395/500.02 |

OTHER PUBLICATIONS

Microsoft Press, Microsoft Press Computer Dictionary, pp. 215 and 384, 1997.

*Primary Examiner*—Tariq R. Hafiz
*Assistant Examiner*—Michael Pender
*Attorney, Agent, or Firm*—William S. Galliani; Pennie & Edmonds LLP

[57] ABSTRACT

An apparatus and method for in-system programming of programmable devices includes a device configuration program with adaptive programming source code instructions that characterize device configuration instructions and data. The adaptive source code instructions may include conditional branches, subroutines, variables, configurable arrays, integer operators, and Boolean operators. These features allow for more compact and efficient device configuration instructions and data. An interpreter converts the device configuration program into formatted device configuration instructions and data. The formatted device configuration instructions and data are preferably compatible with IEEE 1149.1 JTAG-BST specifications. The formatted device configuration instructions and data are used to program a programmable device in the manner specified by the adaptive programming source code instructions.

23 Claims, 2 Drawing Sheets

APPARATUS AND METHOD FOR IN-SYSTEM PROGRAMMING OF INTEGRATED CIRCUITS CONTAINING PROGRAMMABLE ELEMENTS

This application claims priority to the Provisional Application entitled "Apparatus and Method for the In System Programming of Integrated Circuits with Programmable Elements", Ser. No. 60/030,909, filed Nov. 14, 1996.

BRIEF DESCRIPTION OF THE INVENTION

This invention relates generally to integrated circuits. More particularly, this invention relates to a technique for in-system programming of integrated circuits containing programmable elements.

BACKGROUND OF THE INVENTION

Many types of integrated circuits (ICs) contain programmable elements. Programmable logic devices (PLDs) are an example of ICs that contain programmable elements. PLDs are digital, user-configurable integrated circuits. PLDs include an array of logic elements and programmable interconnect circuitry. The logic elements can be programmed to implement logic functions. Logic functions are created by selectively coupling the logic elements of the PLD. The ability to program the logic elements and the interconnect circuitry provides the user with a high degree of flexibility to implement a multitude of custom logic functions of varying complexity.

Programming software is typically used in cooperation with PLDs to perform design entry, design compilation, and verification. The programming software is also used to program the PLD once the design has been compiled and verified. For more information on PLDs and programming software, see the 1996 Data Book from Altera Corporation, San Jose, Calif., which is incorporated by reference herein.

One advantage of using PLDs is the ability to perform in-system programming (ISP). ISP allows users to program and re-program PLDs that have been incorporated into digital systems, such as a PLD soldered onto a printed circuit board. PLDs are commonly implemented in embedded systems. An embedded system is a computer or microprocessor system which is not a general purpose computer workstation, but a system dedicated to a particular function within some larger electronic system. Embedded systems often do not have the peripheral devices and I/O devices that are common on general purpose desktop computers, like keyboards, video displays, and disk drives.

There are two common applications for in-system device programming in an embedded system. One is to program new devices in a new system during the manufacturing process. The other is to re-program devices with an updated version of a pattern, possibly long after the system was manufactured and sold to the end customer. This is known as an "in-field upgrade". In both cases, the programmable device and the computer or microprocessor performing the programming operation (the "host") typically reside together in the same electronic system.

A number of methods to perform ISP are known. Most of these ISP methods rely on a modified version of the IEEE Standard 1149.1—JTAG Boundary Scan Test Procedure (hereafter referred to as JTAG-BST) to perform the ISP. The JTAG-BST standard is described in "IEEE Std. 1149.1-1990, IEEE Standard Test Action Port and Boundary Scan Architecture", published by the Institute of Electrical and Electronics Engineers, which is incorporated by reference herein.

The JTAG-BST is used to insure that the integrated circuits on a printed circuit board are properly mounted and interconnected. To perform a JTAG-BST, the printed circuit board manufacturer generates a serial vector format (SVF) file for the board under test. The SVF file is created from a group of standard instructions defined by the SVF format. An automatic test equipment (ATE) system which interfaces with the integrated circuits on the board, then provides the vectors of the SVF file to the integrated circuits on the board. The vectors pass through boundary scan registers on the integrated circuits, causing certain signals to be generated at the input and output pins of the integrated circuits under test. The ATE system then compares the actual signals generated at the input and output pins with the expected signals to determine if a mounting and/or interconnect problem exists on the board. For more information on JTAG-BST and SVF files, see "Boundary Scan Testing" by Harry Blecker, Kluwer Academic Publishers, 1993 and the Serial Vector Format Specification developed by Texas Instruments, September 1994, both of which are incorporated by reference herein.

As indicated above, programming software can be used to perform ISP. With this method, a programming object file (POF) is loaded onto the computer running the programming software. The POF is a file that contains all the address locations and the programming information needed to configure the PLD to assume the logic function defined by the user. The programming software then takes the data in the POF and generates vectors including instructions and control information which cause the PLD to sequence through its programming modes. To initiate programming, the vectors are down-loaded from the computer to the board containing the PLD via a serial cable that is compliant with the JTAG-BST interface, causing the PLD to be programmed. Although this ISP method is simple, it is relatively slow and therefore is typically used only for design and prototyping, not for large scale production.

ISP is also performed using ATE systems which are normally used to perform JTAG-BST, such as the IC test equipment from Teradyne. The ATE is provided with an SVF file that has been modified to include: (1) address information identifying selected elements in the PLD to be programmed; (2) data to indicate how to program the selected elements; and (3) control information to cause the PLD to sequence through its programming modes so that the selected elements are programmed in accordance with the data. The ATE then down-loads the vectors of the modified SVF file to the PLD for programming. Since the modified SVF file is in the same format as the SVF file used for JTAG-BST, the programming is "transparent" to the ATE. Note that with certain ATE's, such as the HP3070 from Hewlett-Packard, a translated SVF file is provided to the ATE.

Yet another method of ISP involves the use of an embedded processor on the board containing the PLD to be programmed. A modified SVF file, containing the same address, data, and control information as described above, is provided to the embedded processor. The embedded processor then downloads the vectors in the modified SVF file to program the PLD. Since the processor is embedded in the system, this type of ISP can be readily performed in the field by a customer or end user.

There are a number of problems related to using modified SVF files for programming PLDs. SVF files modified for programming PLDs tend to be extremely large because each instruction in the file must include the address to be programmed and the programming data in order to be compliant with the SVF specification. Modified SVF files also tend to be very large because they often contain duplicate copies of the same address and programming data. For example, if the modified SVF file contains information to program a PLD and information to perform two verification tests to confirm the programming of the PLD, then the SVF file essentially contains three copies of the address and programming data. Lastly, since the SVF format was developed for JTAG-BST, the vectors of the file can only be serially executed. Adaptive programming, such as the use of conditional branches, are not permitted under the SVF specification. As a consequence, modified SVF files tend to be cumbersome and inflexible, which makes them less than ideal for ISP. Other problems with SVF include the fact that SVF cannot represent a time delay in real time, only in terms of a number of clock cycles, SVF does not guarantee a particular "path" through the JTAG state machine when making a transition from one state to another, and SVF does not allow some particular state transitions which might be needed for device programming.

In view of the foregoing, it would be highly desirable to provide an improved technique for in-system programming of integrated circuits containing programmable elements.

SUMMARY OF THE INVENTION

An apparatus and method for in-system programming of programmable logic devices includes a device configuration program with adaptive programming source code instructions that characterize device configuration instructions and data. The adaptive source code instructions may include conditional branches, subroutines, variables, configurable arrays, and Boolean operators. These features allow for more compact and efficient device configuration instructions and data. An interpreter converts the device configuration program into formatted device configuration instructions and data. The formatted device configuration instructions and data are preferably compatible with IEEE 1149.1 JTAG specifications. The formatted device configuration instructions and data are used by an embedded controller to program a programmable logic device in the manner specified by the adaptive programming source code instructions.

The device configuration program is very compact compared to an SVF file of the same functionality. The device configuration program executes quickly on a relatively small hardware platform (e.g., a 16-bit microprocessor). The device configuration program uses a relatively small amount of memory and uses memory in a predictable manner.

The interpreter is generic in nature, meaning that it does not contain information about any specific programmable device. The interpreter is stable, as it supports future devices and device revisions without frequent software updates. The interpreter is easily ported to a wide variety of host systems, both 16-bit and 32-bit.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
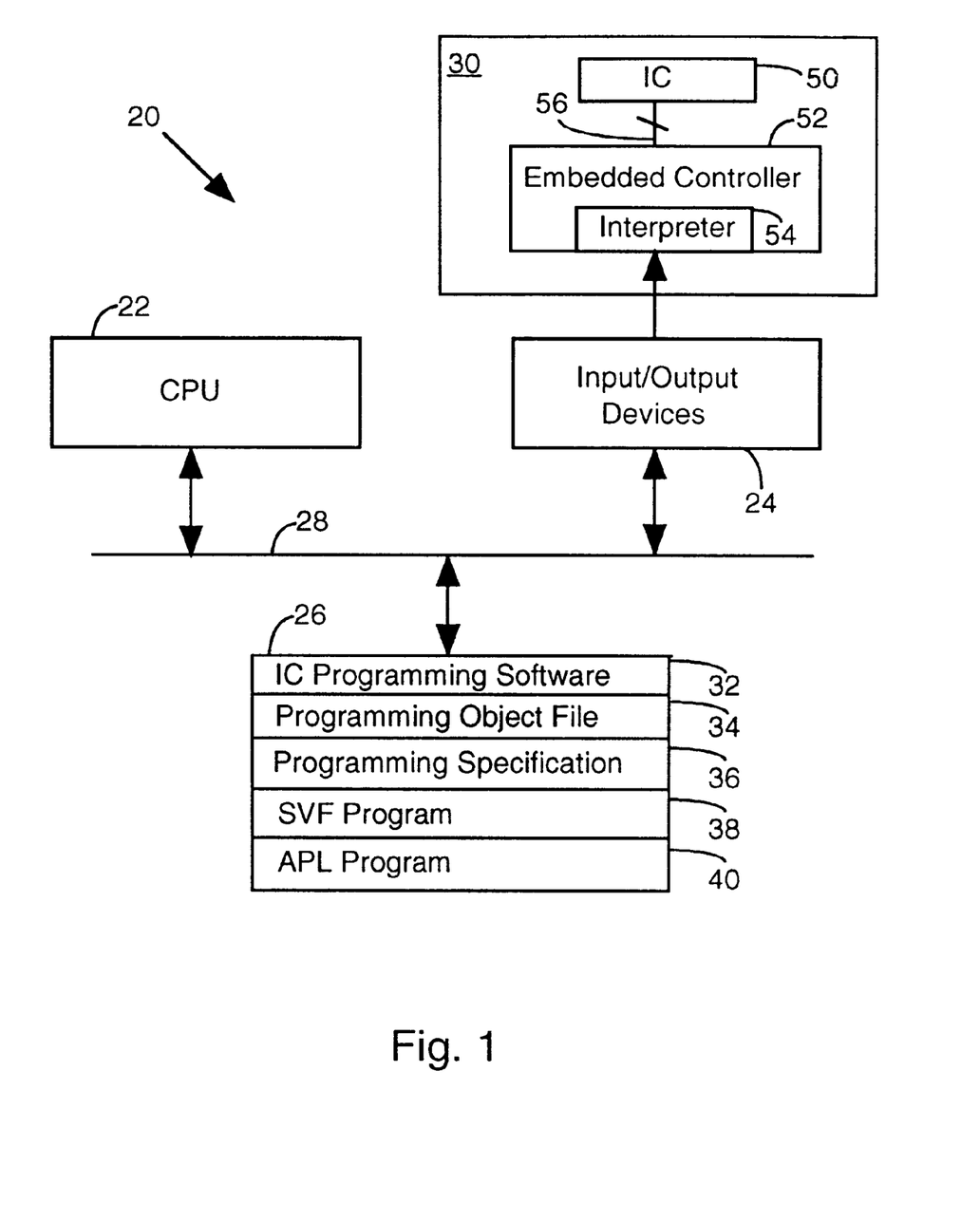
FIG. 1 illustrates an apparatus operated in accordance with an embodiment of the invention.

FIG. 1 illustrates a computer 20 that may be used to practice an embodiment of the invention. The computer 20 includes a central processing unit (CPU) 22, input/output devices 24, and a memory 26, which communicate via a system bus 28. The CPU 22 may be a standard device. The input/output devices 24 may include a keyboard, mouse, monitor, printer, and the like. In addition, the input/output devices 24 include an interface card, for example, a serial port, for communication with a printed circuit board 30. The memory 26 is a standard memory including primary memory and/or secondary memory.

The physical components described up to this point are well known in the art. The invention is more particularly directed toward the programs stored in the memory 26 and their execution and operation in relation to the remaining components of the computer 20. The memory 26 stores IC programming software 32. In general, the IC programming software 32 is for the design entry, design compilation, and verification of a logic design to be implemented in an IC with programmable elements. Prior art IC programming software, such as MAX+PLUS II from Altera Corporation, San Jose, Calif., uses a programming object file (POF) 34 and a programming specification 36 to generate an SVF program 38. The POF 34 provides the programming data to program an IC and the programming specification 36 provides the address locations to be programmed in the IC. This information is utilized in conjunction with a computer code generator to produce an SVF program.

The present invention extends the functionality of prior art IC programming software so that it can be used to generate an Advanced Programming Language (APL) program (also referred to as a device configuration program) 40 in accordance with an embodiment of the invention. In other words, the IC programming software 32 in addition to performing known prior art functions, such as design entry and verification, also includes a code generator to generate a device configuration or APL program 40. The existing features of the MAX+PLUSII programming software from Altera Corporation, San Jose, Calif., such as the design entry features, may be used in accordance with the invention. This existing functionality is supplemented to include a code generator that produces an APL program 40. Construction of a code generator for a new program language is a straight-forward process. The invention is directed toward defining the new APL program language. Thereafter, various techniques to implement the language may be exercised by those skilled in the art. Prior to providing a complete description of the APL program 40 of the invention, attention is directed toward the remaining components shown in FIG. 1.

As indicated above, the input/output devices 24 are connected to a printed circuit board (PCB) 30. The (PCB)+ includes an IC 50 with programmable elements (not shown). The PCB 30 also includes an embedded controller 52 running interpreter software 54. The embedded controller 34 preferably includes JTAG interface circuitry (not shown). A bus 56 is used to route programming signals from the embedded controller 52 to the IC 50.

Embedded controllers to convert an SVF file into a set of control signals that are used to program an IC are known in the art. In particular, such controllers generally generate control signals that are compatible with JTAG-BST specifications. The present invention uses an interpreter 54 to interact with an embedded controller 52 in a known manner, such that the embedded controller 52 generates control signals that are compatible with JTAG-BST specifications. The invention is not directed toward the interaction between an interpreter 54 and an embedded controller 52, which is known, but to a particular type of interpreter 54 that can process an APL program 40 written in accordance with the invention. An interpreter that can process an APL program 40 in accordance with the invention can be readily ported to any number of embedded controllers 52 which will generate control signals for programming the IC 50.

Figure 2:
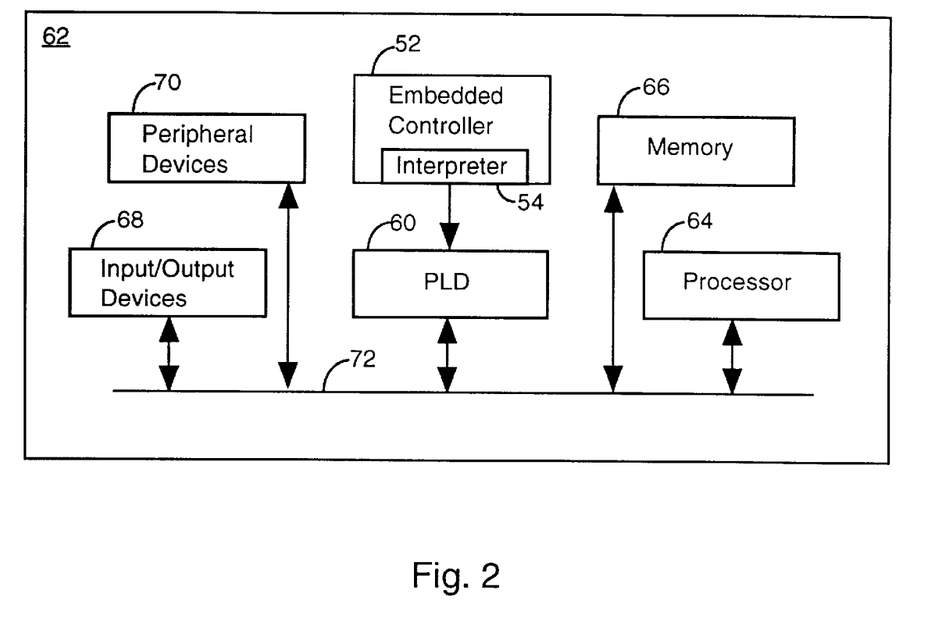
FIG. 2 illustrates a digital system incorporating an embedded controller and programmable logic device operating in accordance with an embodiment of the invention.

FIG. 2 illustrates the embedded controller 52 connected to a programmable logic device 60 forming a portion of a data processing system 62. The data processing system 62 may include one or more of the following sub-system functional components: a processor 64, memory 66, input/output circuitry 68, and peripheral devices 70. These components are coupled together by a system bus 72. Controller 52 and processor 64 may be combined into one unit; that is, the functions of the controller 52 and processor 64 may be performed by a single processor, instead of two.

The system 62 can be used in a wide-variety of applications, such as computer networking, data networking, instrumentation, video processing, digital signal processing, or any other application where the advantage of using reprogrammable logic is desirable. The PLD 60 can be used to perform a variety of different logic functions. For example, PLD 60 can be configured as a processor or controller that works in cooperation with processor 64. The PLD 60 may also be used as an arbiter for arbitrating access to a shared resource in the system 62. In yet another example, the PLD 60 can be configured as an interface between the processor 64 and one of the other components in the system 62.

Returning to FIG. 1, the APL program 40 contains all the information needed to program the PLD 60 for one of these functions. To initiate ISP, the APL program 40 is downloaded to the embedded controller 52 on the PCB 30. The APL interpreter 54 reads each line of the APL program 40, interprets it, and provides the interpreted code to the embedded controller 52 for execution. The embedded controller 52 then generates and transmits the resulting instructions and control signals to program and verify the IC 50. In an alternative embodiment, the APL program 40 can be downloaded from the computer 20 as an interpreted program for direct execution by the embedded controller 52.

The APL program 40 is constructed from a simple programming language developed specifically for in-system programming of ICs containing programmable elements, such as PLDs. The APL language provides a number of advantages for ISP. The APL language permits programming data and address location information in an APL program 40 to be stored in arrays and similar data structures. Instructions in the APL program 40 can refer to such arrays, and therefore it is not necessary to include actual address and programming data information in each instruction. As a result, the APL program is relatively compact because data fields in the instructions are smaller and the need to duplicate data for programming and verifying is substantially reduced.

The APL language used by an APL program provides adaptive programming capabilities that include conditional branching, variables, and subroutines. Conditional branching permits programming and verification under certain set conditions. For example, after a group of logic elements has been programmed, it may be advisable to branch to a conditional subroutine that verifies the programmed logic elements. If the programming is verified after the first pass, then the subroutine is exited. If the programming is not verified, the programming may be repeated up to a preset variable number of times. If the programming is not verified after the variable number of passes, then an error condition will be noted.

As indicated above, ISP is advantageous because it permits an end user to reconfigure re-programmable ICS, such as certain types of PLDs in the field. For example, in the communication industry communication protocols are often updated. If a party developed a board that contained one or more such PLDs that implement the original communication protocol, then it may be possible to simply re-program the PLDs to the updated protocol, rather than designing a new board. However, in field re-programming of PLDs using the methods described in the background section is sometimes problematic because there may be many different versions of the PLD requiring different programming sequences.

The present invention provides an electronic signature feature which eliminates the aforementioned problem. An IC may contain electronic information that identifies the revision number of the IC. Subsequently, when the IC 50 is to be programmed, the signature information can be read by the controller 52. In one embodiment, the proper information to program a particular revision of an IC can be accessed in the APL program 40 by using a series of IF, THEN, ELSE statements. For example, if the electronic signature information "C" is read from a PLD to be reprogrammed, the controller 52 can find the matching information "C" in the APL program 40 and reprogram the chip by executing the following sequence of instructions:

---
IF SIGNATURE = A, THEN
    execute instructions to program A
ELSE IF SIGNATURE = B THEN
    execute instructions to program B
ELSE IF SIGNATURE = C THEN
    execute instructions to program C

---

The adaptive programming capabilities of the APL language is also useful for reducing the size of the program files. Rather than storing two separate program files for a first revision and a second revision of a particular IC, the adaptive programming allows the program file information common to both revisions to be stored in one block of memory, the information specific to the first revision to be stored in a second block of memory, and the information specific to the second revision to be stored in a third block of memory. This feature significantly reduces the size of the memory needed to store the program files because it reduce the need to store duplicate copies of the common information.

The invention and its attributes have now been fully described. Attention presently turns to a more detailed description of a particular embodiment of the invention. In particular, by way of example, applicant will now fully describe one embodiment of an APL programming language that may be used in accordance with the invention. Subsequently, applicant will fully describe one embodiment of an interpreter that may be used in accordance with the invention.

APL LANGUAGE OVERVIEW

As previously indicated, APL is a programming language designed specifically to support programming logic and memory devices via the IEEE 1149.1 JTAG-BST interface. APL is an interpreted language, meaning that APL program 40 source code is executed directly by an interpreter program (e.g., interpreter 54) running on a host computer (e.g., embedded controller 52), without first being compiled into binary executable code. As an APL program is executed by the interpreter, signals may be produced on the IEEE 1149.1 JTAG interface to program a device, as described in the APL program. In other words, the APL program specifies instructions and data that is processed by the interpreter and thereby causes the embedded controller 52 to convert the instructions into JTAG-BST control signals that are used to program a device.

The APL language is designed as a combination of the BASIC Programming Language and the Serial Vector Format (SVF), a specialized format for representing the instructions and data used in IEEE 1149.1 JTAG applications. Like BASIC and SVF, APL is a line-oriented language, consisting of a sequence of program statements. Typically each statement occupies a line of the APL program file 40, but this is not required. (Line breaks are not significant to the APL language syntax, except as they provide a termination for comments.) Each statement is terminated by a semicolon character. A label name followed by a colon character may precede any statement. A single quotation mark character causes all characters up to the next line break to be a comment (i.e. ignored by the interpreter).

Each APL program statement consists of an instruction, followed by zero or more arguments, and terminated with a semicolon character. Arguments may be literal constants, variables, or expressions resulting in the data type expected by the instruction. The type of the arguments is checked by the APL interpreter.

All variables in APL must be declared before they are used, and they always have global scope—that is, they are available to all program statements encountered after the declaration statement. APL programs have variables of two types: integer and Boolean. Integers are 32-bit signed numbers. Boolean variables can be considered to be single-bit unsigned integers, although they cannot be used interchangeably with integer variables. One-dimensional arrays of integer or Boolean type may be declared. These "vectors" are indexed to give access to a single element or a range of elements inside the array. Multi-dimensional arrays are not supported. APL does not support string variables, but string constants and string representations of integer values may be used to form text output messages. A complete set of arithmetic, logical, and relational operators is available for integers, and a complete set of logical operators is provided for Boolean expressions. No operators are provided to work directly on integer arrays or Boolean arrays. For strings, concatenation is available to permit the construction of simple messages.

The initialization value of scalar integer or Boolean variables may be set at run-time using an "initialization list". This list of variable names and values is supplied to the APL interpreter at run-time, and overrides the initialization values found in the APL program. This mechanism is used to permit multiple different operations (for example, device programming and device verification) to be performed using a single APL file. To use this feature, the software which invokes the APL interpreter must know the names and values to supply in the initialization list to obtain the desired result. Some variable names have been standardized for this purpose, as described below.

Program flow in APL is controlled using simple GOTO, CALL/RETURN, and FOR/NEXT structures. The GOTO and CALL instructions refer to labels, which are symbolic names for program statements elsewhere in the APL program. Unlike some versions of BASIC, APL has no line numbers. Since the language itself enforces almost no constraints on the organizational structure or control flow of a program, it is the responsibility of the programmer to avoid creating incomprehensible "spaghetti code". In this regard, APL is like BASIC or Assembly Language.

The APL language is case insensitive. All labels, variable names, instruction names, and other language elements are processed without regard to case. (The only exception is the encoded format used for compressed Boolean array initialization data, which is described below) In this document, APL code examples use upper-case instruction and keyword names and lower case label and variable names, but this is not required by the language. For string constants in PRINT statements, the case is preserved when printing the string.

The only input and output mechanisms supported in APL are the JTAG hardware interface, the initialization list for run-time variable initialization, the PRINT command for output messages, and the EXPORT command for sending data values to the calling program. The APL language does not provide access to any other input or output files or devices. Also, there is no facility for linking multiple APL programs together, or including the contents of another file into an APL program.

APL STATEMENTS AND INSTRUCTIONS

Each statement in an APL program contains three elements: a label, an instruction, and arguments. The number and type of the arguments depend on the instruction. The label is optional; if present, it must be followed by a colon character. A semicolon character terminates the statement.

Each statement begins with the instruction name. The following instruction names are supported: BOOLEAN, CALL, CRC, DRSCAN, DRSTOP, EXIT, EXPORT, FOR, GOTO, IF, INTEGER, IRSCAN, IRSTOP, LET, NEXT, NOTE, PADDING, POP, PRINT, PUSH, REM, RETURN, STATE, and WAIT. Most of these instructions take arguments in the form of variables or expressions. The GOTO and CALL instructions take labels as arguments. The PRINT instruction is special because it takes as its argument a string expression. The JTAG instructions DRSCAN and IRSCAN are special because they take Boolean array expressions as arguments. The RETURN instruction takes no arguments at all.

The sixteen JTAG state names are reserved keywords in APL. They are: DRCAPTURE, DREXMT1, DREXIT2, DRPAUSE, DRSELECT, DRSHIFT, DRUPDATE, IDLE, IRCAPTURE, IREXIT1, IREXIT2, IRPAUSE, IRSELECT, IRSHIFT, IRUPDATE, and RESET.

The following sixteen strings are also reserved keywords in APL, because of their significance in APL statements or expressions: BIN, CAPTURE, CEIL, CHR$, COMPARE, CYCLES, FLOOR, HEX, LOG2, RLC, STEP, SQRT, THEN, TO, and SEC. A detailed specification for each of the supported APL instructions is provided below.

Comments may be placed anywhere in an APL program. They are ignored by the APL interpreter. The beginning of a comment is indicated by a single quotation mark character. Everything from the single quotation mark character to the next line break is ignored.

The REM instruction may be used to create a "remark" statement, which is ignored by the APL interpreter. This statement is terminated by a semicolon, and may span multiple lines. The REM instruction is useful for temporarily removing a statement from a program without regard to the location of line breaks.

APL PROGRAM FLOW

Execution of an APL program always begins at the first line, and terminates with the EXIT instruction. If the end of the file is encountered (i.e. no EXIT instruction was found) this is an error.

The flow of execution in an APL program is controlled using three methods: branches (using the GOTO instruction), subroutine calls (using CALL and RETURN) and loops (using FOR and NEXT).

The APL interpreter manages subroutine calls and loops using a stack. The stack is a repository for information about all activities which may be nested. These nested functions are CALL and RETURN, FOR and NEXT, and PUSH and POP. When a CALL, FOR, or PUSH instruction is encountered, a record is added to the stack with information about the function. When the corresponding RETURN, NEXT, or POP instruction is encountered, the record is removed from the stack. (For the NEXT instruction, the stack record is removed only when the loop has run to completion.)

The size of the stack is limited by a constant in the APL interpreter. This limit specifies the maximum number of levels of nesting of CALL, FOR, and PUSH statements. For example, if an APL program CALLs a subroutine, which contains a FOR loop, which contains a PUSH instruction, this requires three stack records. If an APL program exceeds the available stack space, it will terminate with an error.

The GOTO instruction causes execution to jump to the instruction corresponding to the label provided. This instruction may or may not have been encountered already in the APL program. If the label has not been encountered yet, the remainder APL program will be processed (without executing any instructions) until the label is found, or the end of the program is reached. If the label is found, execution of the program will continue from that point. The IF instruction may be used to create a conditional branch.

The CALL instruction is like the GOTO instruction, but the location of the instruction following the CALL is saved on the stack inside the APL interpreter. When a RETURN instruction is executed, execution will jump to this return location, and the stack record is deleted from the stack. If a RETURN instruction is executed when the stack is empty or does not have a CALL record on top, this is an error. Execution of the program will terminate with a corresponding error code. The IF instruction may be used to call a subroutine conditionally, or to return conditionally.

The FOR instruction is used for iteration, or "looping". Each FOR instruction has an associated integer variable called the "iterator", which maintains a count of the iterations of the loop. When a NEXT instruction using the same iterator variable is encountered, the iterator is incremented (or stepped, if the STEP keyword is used with the FOR instruction). If the iterator has reached its terminal value, the FOR loop is complete and control is passed to the instruction following the NEXT instruction. Otherwise, control jumps back to the instruction following the FOR instruction.

FOR loops may be nested. When a FOR instruction is encountered, the APL interpreter pushes a FOR record onto the stack. This record stores the name of the iterator variable and the location of the FOR instruction. When the corresponding NEXT instruction is encountered, the iterator variable is updated to the next value, and the terminating condition is evaluated. If the FOR loop has reached its terminal value, the FOR loop record is deleted from the stack and control jumps to the instruction following the NEXT instruction, else control continues at the instruction following the FOR instruction. If a FOR instruction is encountered which uses the same iterator variable as the current FOR loop at the top of the stack, this is an error. If a NEXT instruction is encountered and the top record on the stack is not a FOR record with the same iterator variable, or if the stack is empty, this is an error. When nesting one FOR loop inside another, the inner loop must run to completion before the NEXT instruction of the outer loop is encountered. When nesting a FOR loop inside a subroutine, the FOR loop must run to completion before the RETURN instruction is encountered.

APL DATA MANAGEMENT

Variable names are limited to 32 characters, and must begin with an alphabetic character (not a number). The set of legal characters for variable names is all alphabetic and numeric characters and the underscore character—no other characters are allowed. Variable names are not case sensitive—two variable names which differ only by case will be considered equivalent. (These restrictions apply to labels as well.)

As noted above, the two data types available in APL are integer and Boolean. These types may be used to declare "scalar" variables and one-dimensional arrays. Any variable or array must be declared before any reference to it is made.

By default, all variables and arrays are initialized to zero by the APL interpreter when they are created. Variables and arrays may also be explicitly initialized at the time of declaration using the INIT keyword. Arrays with explicit initialization are always "read-only", that is, no element of the array may be modified by the APL program. For initialization of Boolean arrays, the initial array data may be specified in one of five ways: as a comma-separated list of values, in binary (one bit per character), in hexadecimal (four bits per character), or in a modified hexadecimal format containing run-length compression codes (more than four bits per character), or in some other compressed format. In the compressed modes, the initialization data will not be human-readable. For initialization of integer arrays, the initial array data must be specified as a comma-separated sequence of decimal numbers. In both cases, the size of the initialization data must exactly equal the size of the array to be initialized, otherwise it is an error.

Array data may be accessed three ways: by indexing (using an integer) resulting in a single scalar value, sub-range indexing (using two integers) resulting in a smaller array, or collectively as an array. Boolean arrays and sub-range indexed arrays may only be used as arguments in DRSCAN and IRSCAN statements, which accept Boolean array arguments. No arithmetic, logical, relational, or assignment operators are provided for whole arrays or sub-range indexed arrays.

Literal data values may appear in integer or Boolean expressions. For example, n the statement LET a=a+1; the number one is a literal value. The literal values 0 and 1 may be used in either integer or Boolean expressions; other signed decimal numbers between −2147483647 and 2147483647 may be used only in integer expressions. Only decimal format is supported.

For Boolean array expressions, a literal Boolean array value may be expressed as a Hexadecimal string. Such literal arrays may be used as arguments for DRSCAN and IRSCAN statements, which expect Boolean arrays as arguments. In this case, as with initialization, if the size of the literal array is different from the expected size, it is an error.

Hexadecimal Boolean array constants must begin with a numeric character to avoid confusion with variable names. No format is supported for literal use of integer arrays. Text strings must be specified as literal values for the PRINT statement, since APL does not support any character or string variable types.

Since APL is an interpreted language, no special syntax is provided for integer or Boolean constants. A variable should be declared with an initialized value when a symbolic name for a quantity is desired.

The algorithm for converting initialization data for Boolean arrays into run-length compressed form and the syntax for representing such data in an APL program are as follows. A compressed array consists of a sequence of data blocks of two types: random data and constant data. For blocks of random data, the block contains the length (in bits) and the data itself. For constant data, the block contains the constant value (0 or 1) and the number of repetitions of the constant value. The uncompressed data is searched (beginning with the bit which appears at index zero in the array) for any sequence of repeated ones or zeros, located at contiguous positions in the array, satisfying a minimum sequence length. Such sequences are stored into the compressed array as constant blocks, and the random data outside those sequences is stored as random data blocks.

The character set used for compressed arrays is the set of digits 0-9, alphabetic characters A–Z, and a–z (case is significant!), the underscore character (_) and the "at" character (@). These 64 characters are used to represent numeric quantities, as shown in the following 'C' program code:

```
if       ((ch >= '0') && (ch <= '9')) result = (ch – '0');
else if  ((ch >= 'A') && (ch <= 'Z')) result = (ch + 10 – 'A');
else if  ((ch >= 'a') && (ch <= 'z')) result = (ch + 36 – 'a');
else if  (ch == '_') result = 62;
else if  (ch == '@') result = 63;
```

Line breaks and other white-space characters may occur at any position inside the compressed array. Each data block begins with a block identifier character, which is always an upper-case alphabetic character (A–Z). The block identifier character is followed by one or more characters specifying the data length, followed by a variable number of characters containing block data (if the block is a random data block). The count value characters are always presented in decreasing order of significance. The ASCII character codes for the block identifier characters are calculated as follows (recall all block identifier characters are in the range A–Z): MSB LSB 0 1 0 Type Value Count 2 Count 1 Count 0. The three most significant bits positions always take the constant values shown above. The bit in the fifth bit position ("Type" above) identifies the type of data block. Zero indicates a constant block, while one indicates a random block. The bit in the fourth position ("Value") indicates the value for a constant block. It should be zero for a constant zero block, and one for a constant one block. It must be set to zero if the block is a random data block. The least significant three bits (Count 2 and Count 0) encode the number of count characters which follow the block identifier character. This must be a number between 1 and 7 (zero is not allowed).

Each count character encodes six bits of the complete count value. For example, three count characters can store an 18-bit binary count value. For random data blocks, the count characters are followed by data characters, each representing six bits of the random data for the block. The six bits are taken LSB first, meaning that the LSB has the least array index. The number of data characters can be calculated from the count value by simply dividing by six, and adding one if the remainder is not zero (if the number of data bits is not an integer multiple of six). The character following the expected data characters should be interpreted as the block identifier for the next block.

Run-length compression is only supported in the BOOLEAN statement, when declaring a Boolean array variable with initialization data. The syntax for this statement is: BOOLEAN vector[<size>]=RLC <compressed array data>.

APL EXPRESSIONS AND OPERATORS

An expression in APL is a collection of variables, literal data values, or other expressions joined together by operators, to describe a computation. Parentheses may be used to control the precedence of evaluation. Every expression produces a result of a type which must match the type of the instruction to which that expression is supplied as an argument.

The APL language offers a complete set of arithmetic, logical, and relational operators. The character codes used for these operators are generally similar to those used in the 'C' programming language. The assignment operator (=) is not included in this list because it is considered to be part of the LET statement. The so-called ternary operator from the 'C' language (A=B?C:D) is not supported in APL. Arithmetic and logical operators always produce a result of the same type as the arguments, while relational operators always produce a Boolean result. The operators are listed below by argument type and result type.

The following arithmetic and logical operators take one or two integer arguments and produce an integer result:

| | |
|---|---|
| + | (addition) |
| – | (subtraction and unary negation) |
| * | (multiplication) |
| / | (division) |
| % | (modulo) |
| & | (bitwise logical and) |
| \| | (bitwise logical or) |
| ^ | (bitwise logical exclusive or) |
| ~ | (bitwise unary inversion) |
| << | (left shift) |
| >> | (right shift) |
| ABS() | (absolute value) |
| LOG2() | (logarithm base 2) |
| SQRT() | (square root) |
| CEIL() | (ceiling -- least integer which is greater than) |
| FLOOR() | (floor -- greatest integer which is less than . . . ) |

By default, the results of division and square-root operations are "rounded down" to the nearest integer value. The ceiling function (CEIL) may be used on the result of a division or square-root operation to cause the result to be "rounded up" to the next integer value. By default, the result of LOG2 is "rounded up" to the nearest integer value. The floor function (FLOOR) may be used on the result of LOG2 to cause the result to be "rounded down".

The following relational operators take two integer arguments and produce a Boolean result:

| | |
|---|---|
| == | (equality comparison) |
| != | (inequality comparison) |
| > | (greater comparison) |
| < | (less comparison) |
| >= | (greater or equal comparison) |
| <= | (less or equal comparison) |

The following logical and relational operators take two Boolean arguments and produce a Boolean result (except the unary inversion operator which takes one Boolean argument):

| | |
|---|---|
| && | (logical and) |
| \|\| | (logical or) |
| ! | (unary inversion) |
| == | (equality comparison) |
| != | (inequality comparison) |

Note that the equality and inequality comparison operators (==and!=) are used for both integer and Boolean arguments. However, the types of the two arguments must agree—that is, an integer argument may not be directly compared to a Boolean argument.

The precedence of APL operators is shown in the table below, in descending order of priority. This precedence table is mostly identical to that of the 'C' programming language. Note that parentheses may be used to force the desired precedence in any expression.

| | |
|---|---|
| !~ | (unary inversion) |
| */% | (multiplication, division, modulo) |
| + - | (addition, subtraction) |
| <<>> | (shift) |
| <<=>>= | (magnitude comparison) |
| ==!= | (equality comparison) |
| & | (bitwise logical and) |
| ^ | (bitwise logical exclusive or) |
| \| | (bitwise logical or) |
| && | (logical and) |
| \|\| | (logical or) |

Integers and Booleans are never automatically converted. A relational operator may be used to convert an integer to Boolean, since relational operators always give a Boolean result. To convert a Boolean bit to an integer, use an IF statement to test the value of the Boolean, and then assign a value to the integer accordingly. The constant literal numbers 0 and 1 may be used either as an integer or as a Boolean value, according to the context.

APL ARRAY OPERATIONS

Square brackets ([ ]) are used to index arrays. The result of indexing is either a single element (integer or Boolean) or a smaller array, representing a subset of the original array. To gain access to a single element of an array, the index consists of a single integer expression. For example, one element of an array may be assigned to another element as follows:

```
LET vect[52]=vect[0];
```

To copy a group of elements from one array to another:

```
FOR i = 0 TO 255
LET dest[i + 256] = source[i];
NEXT i;
```

An array expression may consist of a range of elements from another array variable. The syntax for this is the same as indexing, but with a start index and stop index, separated by two periods (..). This method is used to provide Boolean array expressions for DRSCAN and IRSCAN commands. For example:

DRSCAN length invect[start..stop] CAPTURE outvect;

Other than indexing, no operators are provided to work on array variables. They may only be used with the DRSCAN and IRSCAN instructions, which accept array expressions as arguments.

APL STRING OPERATIONS

String operations may be used only in PRINT statements. A comma (",") is used to concatenate strings. The statement "CHR$" is used to convert an integer to a single ASCII character. Integers are converted to strings automatically in the PRINT statement. For example, the following statement prints out the value of an integer variable: "PRINT "The signed integer value of a is ", a;". The following statement displays the character represented by an integer variable: "PRINT "The character in a is ", CHR$(a), "and you can depend on it.";".

APL INSTRUCTION SPECIFICATIONS

APL instructions were enumerated in APL language overview section above. Attention presently turns to a detailed description of the available APL instructions.

The BOOLEAN instruction declares a variable or an array of Boolean type. Boolean variables may be initialized to 0 or 1, arrays may be initialized using binary, hexadecimal, or run-length compressed format. If no initialization is specified, the variable or array will be initialized to zero.

Syntax:   BOOLEAN <variable name>;
          BOOLEAN <variable name> = <Boolean expression>;
          BOOLEAN <array name> [<array size>];
          BOOLEAN <array name> [<array size>] = <Boolean array initialization data>;

Examples: BOOLEAN status=0;

BOOLEAN vector[32] = BIN 01011010010110100101101001011010;
BOOLEAN vector[32] = HEX 34B4CDB7;
BOOLEAN vector[256] = RLC J2gR1My@x_V1@NpvTs@h2;

The CALL instruction causes execution to jump to the instruction corresponding to the label, and saves a CALL record on the stack. The RETURN instruction is used to return to the instruction after the CALL instruction. The syntax is "CALL <label>;".

CRC is not an executable instruction, but a statement used to verify the data integrity of the APL program. It should be located at the end of the APL file, after all executable APL instructions. When checking the integrity of the APL program, the APL interpreter calculates the CRC (cyclic redundancy check) of all characters in the file or memory buffer, including comments and white-space characters, up to (but not including) the CRC statement. The CRC value obtained is then compared to the value found in the CRC statement. If the CRC values agree, the data integrity of the APL program is verified. The CRC computation is performed using the same method used in POF files, based on the CCITT standard. If the CRC statement is encountered during execution of the APL program, it is an error. The syntax is "CRC <4-digit hexadecimal number>;". For example, a statement may be written as "CRC 9C4A ;".

The instruction DRSCAN specifies a data register scan pattern to be applied to the target data register. The scan data shifted out of the target data register may be captured (in a Boolean array variable), or compared (to a Boolean array variable or constant), or ignored. The data register length is an integer expression. The scan data array contains the data to be loaded into the data register. The data is shifted in increasing order of the array index, that is, beginning with the least index. The capture array is a writable Boolean array variable (i.e. not an initialized array). The compare array and mask array are Boolean arrays, and the result is a Boolean variable which receives the result of the comparison. An unsuccessful comparison will cause a zero (or FALSE) value to be stored in the result variable, but will not interrupt the APL program execution. To abort in the case of an error, a conditional (IF) statement must be used to test the result value, and the EXIT statement called to stop the program. The syntax is:

```
DRSCAN <length>, <scan data array>;
DRSCAN <length>, <scan data array>, CAPTURE <capture array>;
DRSCAN <length>, <scan data array>, COMPARE <compare array>,
    <mask array>,
    <result>;
```

The instruction DRSTOP specifies the JTAG end state for data register scan operations. The state name must be one of the stable states: IRPAUSE, DRPAUSE, RESET and IDLE. The default is IDLE. The syntax is: "DRSTOP <state name>;".

The EXIT instruction terminates the APL program with specified error code. By convention, an error code of zero indicates success, and non-zero values indicate error conditions. The syntax is: "EXIT <integer expression>;".

The FOR instruction initiates a loop. When a FOR statement is encountered, a FOR record is added to the stack, identifying the iterator variable and storing the line of the FOR statement itself. The NEXT statement is used to continue or terminate the loop. When the NEXT statement is encountered, if the loop has not yet run to completion, control jumps to the statement after the FOR statement. If the loop has run to completion, control jumps to the statement following the NEXT instruction, and the FOR record is removed from the stack. The syntax is:

```
FOR <integer variable> = <integer-expr> TO <integer-expr>;
FOR <integer variable> = <integer-expr> TO <integer-expr> STEP <integer-expr>;
```

Example:
FOR index=0 TO (maximum−1);
accumulator=accumulator+vector[index];
NEXT index;

The GOTO instruction causes execution to jump to the instruction corresponding to the label. If the label is not already known, the APL Interpreter will search ahead in the APL program for the desired label. The syntax is: "GOTO <label>;".

The IF statement evaluates a Boolean expression, and if the expression is true, executes a statement. The syntax is: "IF <Boolean expression> THEN <statement>;".

The INTEGER instruction declares an integer variable or array. Integer variables may be initialized to a value between negative 2147483647 ($2^{\wedge\wedge}-1$) and positive 2147483647. Integer arrays may be initialized using a comma-separated list of decimal integer values. Arrays with explicit initialization data are read-only. By default, any variable or array for which no initialization data is provided is initialized to zero. The syntax is:

```
INTEGER <variable name>;
INTEGER <variable name> = <integer-expr>;
INTEGER <array name> [<size>];
INTEGER <array name> [<size>] = <integer-expr>, ... <integer-expr>;
```

Examples:
INTEGER column=−32767;
INTEGER array[10]=21, 22, 23, 24, 25, 26, 27, 28, 29, 30;

The IRSCAN instruction specifies an instruction register scan pattern to be applied to the instruction register. The instruction register data shifted out is ignored. The instruction register length is an integer expression. The instruction data array is a Boolean array expression. The instruction data is shifted into the device in increasing order of the array index. The syntax is: "IRSCAN <length> <instruction data array>;".

The IRSTOP instruction specifies the JTAG end state for instruction register scan operations. The state name must be one of the stable states: IRPAUSE, DRPAUSE, RESET and IDLE. The default is IDLE. The syntax is "IRSTOP <state name>;".

The LET instruction assigns an integer expression to an integer variable, or a Boolean expression to a Boolean variable. The LET statement may be used to assign individual array elements, but not arrays. The syntax is "LET <integer variable>=<integer-expr>;" or "LET <Boolean variable>=<Boolean-expr>;".

The NEXT instruction causes execution to jump to the corresponding FOR instruction, where the value of the iterator variable will be compared to the terminal value. If the loop is complete, execution proceeds at the line following the NEXT instruction, otherwise execution proceeds at the line following the FOR instruction, and the corresponding FOR record is deleted from the stack. The syntax is: "NEXT <variable name>;".

The NOTE statement has no effect on program execution. It is used as a storage mechanism for information about the APL program file which can be extracted from the file without actually executing the APL program. The information which may be stored in NOTE fields includes but is not limited to: the name of the device which the APL program is intended to support; the date when the APL program was created; the design name and design revision used to create the APL program; the name and copyright notice of the software which created the APL program; the component name or reference designator of the particular chip which the APL program is intended to support; the "fuse checksum" of the pattern; the JTAG User Code or UES code of the chip;

the version of the APL language specification used; any title or comment text which may be significant for the user to identify this APL program. The meaning and significance of the NOTE field is determined by a note type identifier. The set of note type identifier strings is suggested by the list above, but has not been defined in this specification. The note text is a string constant, and may be enclosed in double quotation marks. (The double quotation marks are not considered part of the note text.) The syntax is "NOTE <type identifier> <note text>;".

The PADDING instruction specifies the number of padding bits which must be shifted in before and after all subsequent data register scan operations and instruction register scan operations. These padding bits are always ones. The PADDING statement takes four integer arguments: data register pre-padding and post-padding bit counts, and instruction register pre-padding and post-padding bit counts. All must be non-negative integer expressions. The padding values affect all subsequent DRSCAN and IRSCAN statements, until a new PADDING statement is executed to change the padding values. The syntax is "PADDING <pre-data>, <post-data>, <pre-instruction>, <post-instruction>;".

The POP instruction removes a PUSH record from the stack, storing the data value into an integer or Boolean variable. If a Boolean expression is PUSHed, it will be stored on the stack as an integer 0 or 1. Any value may be POPed into an integer variable. If the stack is POPed into a Boolean variable, the value on the stack must be 0 or 1, otherwise an error will occur. The syntax is "POP <integer variable>;" or "POP <Boolean variable>;".

The PRINT instruction prints a message on an output device, if one is installed. If no output device exists, the PRINT statement has no effect. A string expression consists of string constants, integer expressions, and characters generated by the character-code-conversion function (CHR$), concatenated with commas. The syntax is "PRINT <string-expr>;".

The PUSH instruction adds a PUSH record to the stack storing an integer data value. The subsequent POP statement removes the PUSH record from the stack and stores the data value into the corresponding variable. If a Boolean expression is PUSHed, it will be stored on the stack as an integer 0 or 1. If the stack is POPed into a Boolean variable, the value on the stack must be 0 or 1, otherwise an error will occur. The syntax is "PUSH <integer-expr>;".

The REM statement is ignored by the interpreter. Like all statements, it is terminated by a semicolon, so it may be used to force the interpreter to ignore an entire statement up to the next semicolon. Comments and quoted strings will still be recognized inside the REM statement, so the terminating semicolon must not be hidden inside a comment or a quoted string. The syntax is "REM <ignored text>;".

The RETURN instruction jumps to the statement after the corresponding CALL statement, and removes the CALL record from the stack. If the top record on the stack is not a CALL record, an error will occur.

The STATE instruction causes the JTAG state machine to go to the specified state. The syntax is "STATE <state name>;", for example, "STATE IRPAUSE;".

The WAIT instruction causes the JTAG state machine to go to the specified stable state for the number of TCK clock cycles specified, or for at least the specified number of microseconds of real time. A WAIT statement may specify either a clock cycle count or a time delay, or both. If a time delay is specified, the TCK clock may continue to run during the delay, but this is not guaranteed. The time delay is not related to the clock rate of TCK. If either the wait-state or the end-state is not specified, IDLE is assumed. If an END-STATE is specified, the JTAG state machine will go to that state immediately after the specified number of clock cycles or the specified amount of real time has elapsed. The syntax is "WAIT [<wait-state>,] [<integer-expr> CYCLES,] [<integer-expr> USEC, ] [ <end-state>];". This type of time control is not available with SVF files.

The APL language of the invention has now been fully described. In view of this description, one skilled in the art can write programs in the language. Further, one skilled in the art can create a code generation program that generates program code in the APL language. Those skilled in the art will recognize that the APL language is tailored and optimized for programming an integrated circuit that has programmable elements.

THE APL INTERPRETER

After an APL program 40 is constructed, it needs to be interpreted. As shown in FIG. 1, an interpreter 54 within an embedded controller 52 may be used for this operation. The output of the interpreter is then sent to the IC 50 in order to program the IC 50. Attention presently turns to an interpreter 54 that may be used in accordance with an embodiment of the invention.

An APL program 40 is executed by an APL interpreter 54, which is an executable program running on some type of computer system. The mechanism by which the APL interpreter 54 reads the contents of the APL program 40 is platform dependent—it may make use of a file system, or it may simply read characters from a memory buffer. The APL interpreter 54 has access to the hardware JTAG signals which are used for all JTAG operations, including device programming. This hardware I/O interface is also platform dependent. If the APL interpreter 54 is running inside a system which has a console or teletype output device, that device may optionally be used to display messages generated by the APL program 40.

The APL interpreter 54 must have the following capabilities: it can execute an APL program, processing the initialization list if one is present; it can check the CRC of an APL program (without executing it); it can extract information from the NOTE fields of an APL program (without executing it); it has access to the signals of an IEEE 1149.1 JTAG interface; it has a reliable mechanism for creating accurate real-time delays; it can report error status information following the execution of an APL program (e.g. a return code).

After executing an APL program, the APL Interpreter may optionally report statistics about the program, especially the maximum levels of nesting encountered and the quantity of memory required to store program variables. The mechanism for reporting such information is platform-dependent. If a console or teletype output device is available, it may be used to display the messages generated by PRINT statements. If one is not available, then PRINT statements will be ignored.

It is desirable (but not required) that the APL Interpreter should use memory in a simple and predictable way, in order to be compatible with embedded systems which lack a memory-allocation service. The storage requirements of the APL Interpreter include: APL program variables and arrays; APL program stack (used for CALL, FOR and PUSH statements); APL program symbol table (labels and variable names); and Temporary data used by the APL Interpreter.

The simplest interface is one in which the APL Interpreter is supplied with a single memory buffer (of known size) and automatically divides that memory intelligently to satisfy the demands listed above, failing if the size of the memory buffer is insufficient. Such a scheme is preferred for use in embedded systems.

The APL Interpreter is designed to be portable to a wide variety of computer systems, especially microprocessor-based embedded systems. In one embodiment of the invention, 'C' Language source code for the APL Interpreter is provided with documentation to describe the process of porting and installing the software onto a proprietary computer or embedded system. In another embodiment, a binary executable version for a computer may be used, with interface functions for use with a JTAG download cable.

The APL Interpreter has three independent modes of operation: it can execute an APL program, processing the initialization list if one is present; it can check the CRC of an APL program (without executing it.); and it can extract information from the NOTE fields of an APL program (without executing it). These three functions are combined together in a single software module because they share the basic functions which process APL language statements. They are implemented as three separate exported functions in the APL Interpreter software interface.

To execute an APL program, the APL Interpreter 54 reads program statements from the APL program file 40, and executes the statements. All types of statements in the file are processed, except NOTE statements (which are ignored) and CRC statements (which cause an error if they are processed). When an EXIT statement is encountered, execution of the APL program terminates. If an initialization list is provided, it is used to influence the initial values of data variables which may be declared inside the APL program.

During execution of an APL program, the DRSCAN, IRSCAN, WAIT, and STATE instructions cause the APL Interpreter to interact with the signals of the IEEE 1149.1 JTAG interface. If the APL program contains any of these instruction types (which it must for any JTAG application) then the interpreter must be installed with the corresponding JTAG interface functions.

To check the integrity of the APL program file, the actual CRC (cyclic redundancy check) value of the file is compared to the expected CRC value stored in the CRC statement at the end of the file. The CRC statement and expected CRC value is (optionally) computed and added to the file at the time the file is generated. For "hand-edited" APL programs, the CRC statement may be omitted. The CRC check has three possible outcomes: successful match, unsuccessful match, or no CRC statement found. The CRC function used is identical to that specified in the POF file format: it is based on the CCITT standard 16-bit CRC algorithm.

NOTE fields are stored in an APL program as pairs of strings: the first is the key, and the second is the value. The key string must comply with the rules for symbolic names (32 characters or less in length, first character alphabetic, subsequent characters alphanumeric or underscore, case insensitive). The value string may contain any printable ASCII characters (that is, alphabetic, numeric, punctuation and white-space characters), with the restriction that it must be enclosed in double quotation marks if it contains a colon, semicolon, or comment character (single quotation mark). The value string itself may not contain double quotation mark characters. The value string is terminated by a semicolon character. The software interface for extracting NOTE information supports the query of a NOTE value given the key, and extraction of all NOTE fields in the APL program file.

APL INTERPRETER INPUT AND OUTPUT INTERFACES

The sources of input to the APL Interpreter are as follows: the APL program file; the initialization list (described in detail below) which supplies information used during execution of the APL program file; and information which may be obtained from the IEEE 1149.1 JTAG hardware interface during execution of the APL program file. The outputs from the APL Interpreter are: instruction, data, and control information to drive the JTAG hardware interface; optional text messages which may be displayed on an output device (if available); information exported using the EXPORT statement; and an integer return code, and possibly other information returned at the termination of processing.

The I/O functions of the APL Interpreter are encapsulated in a small set of customizable I/O functions. This approach permits engineers to easily port the program to a wide variety of systems with different I/O interface requirements.

The interface for reading data from the APL program file is encapsulated in two functions which must be customized for the target application. The two interface functions for APL program input are: apl_getc( ) and apl_seek( ). These functions are described in detail below. In the case where the APL program file is actually a file in a file system, the standard 'C' language file I/O functions fgetc( ) and fseek( ) may be used. Note that in this case, the calls to the 'C' language fopen( ) and fclose( ) functions, as well as storage of the file pointer, are not managed by the APL Interpreter and must be included in the customization code.

The initialization list is accessed by a pointer passed to the APL Interpreter when executing an APL program. This pointer is the address of a table of pointers, which is terminated by a NULL pointer. Each pointer in the table is the address of a character string containing an initialization statement, in the form "variable=value". If a variable of the specified name is declared in the APL program, its initialization value is forced to the value specified in the initialization statement. If such a variable is never declared in the program, then the initialization statement is ignored. If the initialization value is illegal for the type of the variable in the APL program, then the program terminates with an error.

The JTAG hardware interface is implemented using a single customizable function. This function is called apl_jtag_io( ). This function sets the logic levels of the TDI, TMS, and TCK signals to the JTAG hardware interface, and returns the logic level of the TDO signal from the JTAG hardware. The TDO level is sampled after the other signals have been set to their new values. The nTRST signal is not used.

If a console or teletype output device is available, it may be used to display the messages generated by PRINT statements. If one is not available, then PRINT statements will be ignored. The message function interface is implemented using the function apl_message( ). If the standard 'C' language console output finctions are available, the function puts( ) may be used for text message output. If no message device is available, this function should simply do nothing, then return.

Each of the three exported functions of the APL Interpreter returns an integer result which indicates the success or failure of the function at the end of execution, and the type of error that occurred (if any). The error codes supported are listed below.

In addition to the return code, some exported finctions store resulting data into buffer areas provided by the calling program. For example, the apl_get_note( ) function copies note value strings into a text buffer provided by the calling program. These interfaces are described in detail below.

There is a customizable function used to make accurate delays in real time. The function is apl_delay( ). This function may contain a "busy-loop" which is calibrated for the speed of the particular target system, or it may make reference to a hardware timer device in the target system to measure the passage of time. For successful device programming, it is important that this function perform accurately over the full range of one millisecond to 1000 milliseconds (one second), with a tolerance of zero in the negative direction (i.e., the function must not return in less than the time specified), and up to 100% in the positive direction (i.e. the function may consume up to twice the requested time). Of course, any error in the positive direction will increase the total programming time for a device programming application.

APL INTERPRETER ALGORITHMS

The processing of expressions in the APL Interpreter is performed using code generated by YACC, based on a grammar definition file (.y). The source code provided externally will not include this YACC grammar file, but will include the 'C' language source code (generated by YACC) which implements the grammar. For this reason, the YACC program is not required to port and install the APL Interpreter on the user's target system.

In APL there are four categories of symbolic names which are stored in the symbol table. These are: label names, scalar variable names, and the names of writable array variables and read-only array variables. All these names occupy the same "name space" and must not collide—that is, a label name may not be identical to a variable name in the same APL program, and no two variables, scalar or array, may share the same name. All symbolic names are limited to 32 characters which must be alphanumeric or underscore characters, must start with an alphabetic character, and are case insensitive.

Each entry in the symbol table stores a symbolic name, and information about the object to which the name refers. Every entry has a type identifier which specifies the type of object associated with the symbolic name. In addition, labels have the offset in the APL file of the statement corresponding to the label, scalar variables have the current value of the variable, writable array variables have the array size and a pointer to the array data buffer, and read-only (initialized) array variables have a pointer to the cache structure used to incrementally decompress the array data.

Array variables with initialization data are always read-only variables in APL. Since the data values in such an array may not be modified, no memory is allocated to hold the array data. The symbol table stores the location of the array initialization data in the APL program file, and the data is retrieved directly from the file when it is referenced. If the initialization data is stored in compressed form in the APL program file, it is decompressed incrementally as needed during program execution. In this case, the symbol table stores the location of the beginning of the current compression block, and the array index corresponding to the first array element in that block. If the APL program makes reference to an array element at an index less than the first index in that block, then the compressed array data is processed again from the beginning of the array.

The APL Interpreter uses memory in a simple and predictable way, in order to be compatible with embedded systems which lack a memory-allocation service. The memory requirements of the APL Interpreter include: APL program variables (scalar and array variables); APL program stack (used for CALL, FOR and PUSH statements); APL program symbol table (labels and variable names); and temporary data used by the APL Interpreter. The calling program must provide the APL Interpreter with a single memory buffer of known size. The APL Interpreter automatically divides that memory intelligently to satisfy the demands listed above, failing if the size of the memory buffer is insufficient.

The APL Interpreter will also use some space on the system stack. This system stack usage should be small (a few Kbytes at the most), and is a necessary consequence of implementing the APL Interpreter in a high-level language 'C').

APL INTERPRETER PUBLIC INTERFACE

The APL Interpreter has three exported functions and five customizable interface functions. The exported functions are apl_execute( ), apl_get_note( ), and apl_check_crc( ). The customizable interface functions are apl_getc( ), apl_seek( ), apl_jtag_io( ), apl_message( ), and apl_delay( ).

Attention presently turns to a discussion of these different functions. The apl_execute function is used to cause the APL Interpreter to exec ute an APL program file. The syntax is: "short apl_execute(char **init_list, char *workspace, long size);". The pointer "init_list" is the address of a table of string pointers, each of which contains an initialization string. The table is terminated by a NULL pointer. If no initialization list is needed, then a NULL value may be used to signify an empty initialization list. The "workspace" pointer and "size" parameter provide working memory for the APL Interpreter to use for all purposes during the processing of the APL program file. If the workspace buffer is too small, an error will occur. The return value is zero if the APL program was successfully processed. Otherwise, a non-zero error code is returned.

The apl_get_note function extracts a single note value string from an APL program file. The syntax is: "short apl_get_note(long *offset, char *key, char *value, short length);". There are two ways to use this function. To get the note value for a given key, the key string is provided for the key parameter, NULL is passed for the offset pointer, and a buffer of sufficient length is provided for the value parameter, with the length parameter set to the buffer length. This causes the entire APL program file to be searched for a NOTE file with a matching key. If such a NOTE is found, the value string is copied to the value buffer (up to length bytes), and a zero return code is returned. A non-zero return code is returned if the NOTE key was not found.

To extract all NOTE fields, a buffer of at least 33 characters in length must be provided for the key parameter (32 key characters+NULL character). The offset parameter is a pointer to a long integer storing the current position in the APL program file, beginning with zero. The apl_get_note( ) function may be called multiple times, each time yielding a NOTE key/value pair, until the function returns an unsuccessful (non-zero) return code. Each time the function is called, it will save the position of the end of the previous NOTE statement in the long integer pointed to by offset.

The apl_check_crc function reads the entire APL program file from the beginning until the CRC statement is found or until the end of the file is reached. While reading the file, the CRC (cyclic redundancy check) value of the file data is computed. The value of the computed CRC depends on all characters in the file up to the CRC statement, including comments and white-space characters, and is sensitive to the order in which they appear (unlike a checksum, which is order insensitive). If the CRC statement is found, the value stored there is compared to the computed value. The prototype for the function is "short apl_check_crc(short *expected_crc, short *actual_crc);". If the expected_crc pointer is not NULL, the CRC value stored in the file (if any) is copied there in the form of a 16-bit integer. If the actual_crc pointer is not NULL, the CRC value computed from the file data is copied there in the form of a 16-bit integer, this permits the conflicting values to be displayed in an error message if appropriate. The return code is zero if the CRC values match, or if no CRC statement was found in the file. Otherwise, a non-zero value is returned.

The apl_getc function reads a character from the APL program file. The syntax is: "short apl_getc(void);". The return value is the character code of the character that was read, or (−1) if no character is available—for example, if the end of the file was reached. Each call to apl_getc( ) advances the current position in the file, so that successive calls get sequential characters from the file. This is similar to the behavior of the standard 'C' function fgetc( ).

The apl_seek function sets the current position in the APL program file input stream. The syntax is: "short apl_seek(long offset);". The function returns zero for success, or a non-zero value if the request offset was out of range. This is similar to the standard 'C' function fseek( ).

The apl_jtag_io function provides access to the JTAG hardware interface. The syntax is: "short apl_jtag_io(short tms, short tdi);". Each time this function is called, the logic levels of the JTAG TMS and TDI output signals are set to the requested values, the TCK clock signal is strobed (high, then low), then the TDO input signal from the JTAG hardware is sampled and returned in the return code. The tms parameter indicates the state of the TMS signal, and the tdi parameter indicates the state of the TDI signal. The return code is zero if TDO was low, non-zero if TDI was high.

The apl_message function is used to display text messages on an output device. The syntax is: "void apl_message(char *message);". The APL Interpreter does not append a new-line character at the end of the message string, so for some applications it may be appropriate to do so inside the apl_message( ) function. If the standard 'C' language console output functions are available, the function puts( ) may be used. If no message device is available, this function should simply do nothing, then return. The apl_delay function provides a calibrated time delay. The syntax is: "void apl_delay(short milliseconds);". The milliseconds parameter specifies the length of the delay requested in milliseconds. As mentioned above, for device programming applications it is important that this function provide an accurate time delay of no less than the time requested. This may be accomplished using software loops, or using a hardware timing device such as a programmable timer, if available.

The invention has now been fully described. Those skilled in the art will recognize any number of alternative embodiments that encompass the scope of the invention. For example, memory 26 may store an interpreter 54, in which case the APL program 40 is pre-compiled before being sent to the embedded controller 34. This would eliminate the need for the interpreter 54 in the embedded controller 52. Further, the APL program 40 can be stored in compressed form in the memory 26 and then be decompressed by a program in memory 26 or by the embedded controller 34 during ISP. The present invention can be used with any type IC with programmable elements, including but not limited to memory chips, PLDs, fuse devices, anti-fuse devices, FPGAs, etc. In addition, the invention can be used for optical or magnetic storage devices which are programmed using electrical signals.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A computer readable memory to direct a programmable logic device controller to generate controls signals to program a programmable device in a specified manner, comprising:

executable instructions stored in said memory, said executable instructions including a programmable logic device configuration program including adaptive programming language source code instructions that characterize programmable logic device configuration instructions and data; and an interpreter to convert said programmable logic device configuration program into formatted programmable logic device configuration instructions and data for processing by said programmable logic device controller such that said programmable logic device controller applies controls signals that program said programmable logic device in a manner specified by said adaptive programming language source code instructions.

2. The apparatus of claim 1 wherein said adaptive programming language source code instructions include conditional branches.

3. The apparatus of claim 1 wherein said adaptive programming language source code instructions include subroutines.

4. The apparatus of claim 1 wherein said adaptive programming language source code instructions include variables.

5. The apparatus of claim 1 wherein said adaptive programming language source code instructions include configurable arrays.

6. The apparatus of claim 1 wherein said adaptive programming language source code instructions include integer and Boolean operators.

7. The apparatus of claim 1 wherein said device configuration program is at least partially stored in a compressed format.

8. The apparatus of claim 1 wherein said device configuration program is generated with integrated circuit programming software.

9. The apparatus of claim 1 wherein said formatted programmable logic device configuration instructions and data are compatible with IEEE 1149.1 JTAG-BST specifications.

10. The apparatus of claim 1 wherein said interpreter includes instructions to perform a cyclic redundancy check operation on said device configuration program.

11. The apparatus of claim 1 wherein said interpreter facilitates the implementation of specified real time delays in said programmable logic device.

12. The apparatus of claim 1 wherein said interpreter is stored in a memory of said programmable logic device controller.

13. The apparatus of claim 1 wherein said device configuration program and said interpreter are stored in the memory of a general purpose computer.

14. The apparatus of claim 1 wherein said programmable logic device controller is selected from the group including an embedded controller, a microprocessor, and a computer.

15. A computer readable memory, comprising:

executable instructions stored in said memory, said executable instructions including a programmable logic device configuration program including adaptive programming language source code instructions that characterize programmable logic device configuration instructions and data for use in generating control signals that program a programmable logic device.

16. The apparatus of claim 15 wherein said adaptive programming language source code instructions include conditional branches, subroutines, variables, configurable arrays, integer operators, and Boolean operators.

17. The apparatus of claim 16 further comprising:

a circuit with an interpreter to process said programmable logic device configuration program;

a programmable logic device, connected to said circuit, for programming in accordance with said programmable logic device configuration program;

a system bus connected to said programmable logic device; and a plurality of sub-system functional elements connected to said system bus.

18. A computer readable memory, comprising:

executable instructions stored in said memory, said executable instructions including an interpreter to convert a programmable logic device configuration program with adaptive programming language source code instructions into formatted programmable logic device configuration instructions and data that are used by a programmable logic device controller to generate control signals that program a programmable logic device.

19. The apparatus of claim 18 wherein said formatted programmable logic device configuration instructions and data are compatible with IEEE 1149.1 JTAG-BST specifications.

20. The apparatus of claim 18 further comprising:

a circuit storing said interpreter and processing said programmable logic device configuration program;

a programmable logic device, connected to said circuit, for programming in accordance with said programmable logic device configuration program;

a system bus connected to said programmable logic device; and a plurality of sub-system functional elements connected to said system bus.

21. A method of programming a programmable logic device, said method comprising the steps of:

generating a programmable logic device configuration program including adaptive programming language source code instructions that characterize programmable logic device configuration instructions and data;

interpreting said programmable logic device configuration program to yield formatted programmable logic device configuration instructions and data;

deriving programmable logic device control signals corresponding to said formatted programmable logic device configuration instructions; and programming a programmable logic device with said programmable logic device control signals.

22. The method of claim 21 wherein said generating step includes the step of generating adaptive programming language source code instructions with conditional branches, subroutines, variables, configurable arrays, integer operators and Boolean operators.

23. The method of claim 22 wherein said interpreting step includes the step of yielding formatted programmable logic device configuration instructions and data that are compatible with IEEE 1149.1 JTAG-BST specifications.

* * * * *